US006753702B2

(12) United States Patent
Mizuno et al.

(10) Patent No.: US 6,753,702 B2
(45) Date of Patent: Jun. 22, 2004

(54) SEMICONDUCTOR INTEGRATED CIRCUIT AND ITS LAYOUT METHOD

(75) Inventors: Masaharu Mizuno, Tokyo (JP); Shigeki Sakai, Tokyo (JP); Naotaka Maeda, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 24 days.

(21) Appl. No.: 10/230,197

(22) Filed: Aug. 29, 2002

(65) Prior Publication Data

US 2003/0051221 A1 Mar. 13, 2003

(30) Foreign Application Priority Data

Aug. 29, 2001 (JP) .......................................... 2001-259136
May 9, 2002 (JP) .......................................... 2002-133647

(51) Int. Cl.[7] .............................................. H03K 19/00
(52) U.S. Cl. .............................. 326/93; 326/38; 326/101
(58) Field of Search ........................ 326/37–41, 93–98, 326/101–103

(56) References Cited

U.S. PATENT DOCUMENTS

| 5,239,215 | A | | 8/1993 | Yamaguchi | |
|---|---|---|---|---|---|
| 5,497,109 | A | * | 3/1996 | Honda et al. ................. | 326/93 |
| 5,668,484 | A | * | 9/1997 | Nomura ....................... | 326/93 |
| 5,686,845 | A | * | 11/1997 | Erdal et al. ................... | 326/93 |
| 5,923,188 | A | * | 7/1999 | Kametani et al. ............. | 326/93 |
| 6,144,224 | A | * | 11/2000 | Lee et al. ..................... | 326/93 |
| 2003/0197529 | A1 | * | 10/2003 | Campbell ..................... | 326/93 |

FOREIGN PATENT DOCUMENTS

| EP | 0 394 598 | | 10/1990 |
|---|---|---|---|
| JP | 62-4343 | * | 1/1987 |
| JP | A 5-243534 | | 9/1993 |
| JP | 6-188397 | * | 7/1994 |
| JP | 06-188397 | | 7/1994 |
| JP | 6-244282 | * | 9/1994 |
| JP | 08-166025 | | 5/1996 |
| JP | 10-107236 | | 4/1998 |
| JP | 10-308450 | * | 11/1998 |
| JP | 11-111850 | * | 4/1999 |
| JP | 2000-294651 | * | 10/2000 |
| JP | A 2001-217392 | | 8/2001 |

* cited by examiner

*Primary Examiner*—Don Le
(74) *Attorney, Agent, or Firm*—Young & Thompson

(57) ABSTRACT

The master slice type semiconductor integrated circuit includes sequential circuit cells (2) and combinational circuit cells (3), which are alternately arranged in an inner core area on a semiconductor chip (1), and a plurality of selective driving elements (MC101 to MC108, MC201 to MC216 and MC301 to MC316), which are connected in a shape of a tree, for selectively distributing a poliphase clock signal for each division area formed by uniformly dividing the inner core area. The plurality of selective driving elements are placed and connected on the semiconductor chip such that load and wiring length between the sequential circuit cells within the respective division areas and input terminals to which the poliphase clock signal is inputted are equal. Due to this configuration, it is possible to cope with a poliphase clock, and also possible to reduce a clock skew between circuits, and further possible to provide a master slice type semiconductor integrated circuit in which an electric power consumption can be reduced.

8 Claims, 15 Drawing Sheets

Fig. 9

| CONTROL SIGNALS OF MULTIPLEXER FOR CLOCK DISTRIBUTION |||||||||||||||||||||| CLOCK SIGNALS DISTRIBUTE TO EACH AREA ||||
|---|---|---|---|---|---|---|---|---|---|---|---|---|---|---|---|---|---|---|---|---|---|---|---|---|---|
| MC101 ||| MC102 ||| MC103 ||| MC104 ||| MC201 || MC202 || MC203 || MC204 || MC301 | MC302 | MC303 | MC304 | Area1 | Area2 | Area3 | Area4 |
| S0 | S1 | S2 | S0 | S1 | S2 | S0 | S1 | S2 | S0 | S1 | S2 | S0 | S1 | S0 | S1 | S0 | S1 | S0 | S1 | S0 | S0 | S0 | S0 | | | | |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | a (CLK_A) | a (CLK_A) | c (CLK_C) | c (CLK_C) |
| 0 | 0 | 0 | 0 | 0 | 1 | 0 | 1 | 0 | 0 | 1 | 1 | 0 | 0 | 0 | 1 | 1 | 0 | 1 | 1 | 0 | 0 | 0 | 1 | a (CLK_A) | b (CLK_B) | c (CLK_C) | d (CLK_D) |
| 1 | 0 | 0 | 1 | 0 | 1 | 1 | 1 | 0 | 1 | 1 | 1 | 0 | 1 | 1 | 1 | 0 | 1 | 1 | 1 | 1 | 1 | 1 | 0 | b (CLK_B) | a (CLK_A) | d (CLK_D) | c (CLK_C) |
| 1 | 0 | 0 | 1 | 0 | 1 | 1 | 1 | 0 | 1 | 1 | 1 | 1 | 1 | 1 | 1 | 1 | 1 | 1 | 1 | 1 | 1 | 1 | 1 | b (CLK_B) | b (CLK_B) | d (CLK_D) | d (CLK_D) |

SEMICONDUCTOR INTEGRATED CIRCUIT AND ITS LAYOUT METHOD

BACKGROUND OF THE INVENTION

1. Field of the Invention

The present invention relates to a master slice type semiconductor integrated circuit in which various logic circuits are formed by commonly carrying out product steps except a wiring step, and changing only the wiring step.

2. Description of the Related Art

Conventionally, a semi-custom designing method is known, as a technique for designing a semiconductor integrated circuit such as LSI and the like, in a short time. In particular, this method includes a master slice method in which a master slice containing a cell having a basic level function, such as a logic gate, a flip-flop and the like, is prepared in advance, and a user then determines a wiring pattern in accordance with an individually given logic circuit and attains a desirable semiconductor integrated circuit.

FIG. 1A is a plan view showing a chip structure of the conventional master slice type semiconductor integrated circuit, and FIG. 1B is a plan view in which a transistor cell of the semiconductor integrated circuit of FIG. 1A is enlarged. A semiconductor integrated circuit 101 of the conventional master slice type has the array structure in which transistor cells 102 of the same dimension having the structure shown in FIG. 1B are arranged as a matrix on a chip. In FIG. 1B, a reference number 103 denotes a gate electrode, and a reference number 104 denotes a diffusion layer.

Also, in the conventional master slice type semiconductor integrated circuit, a clock signal is distributed to respective circuits on the chip by using a tree structure of a clock buffer referred to as a clock tree. FIG. 2 is a plan view showing a clock distributing method in the conventional master slice type semiconductor integrated circuit.

In the tree structure of the clock buffer, a clock signal CLK is distributed from a first clock buffer 105 at a center to a plurality of second clock buffers 106, and the clock signal CLK is distributed from the second clock buffer 106 to a plurality of third clock buffers 107. Moreover, the clock signal CLK is distributed from the third clock buffer 107 to a circuit 108, such as a flip-flop circuit and the like. A sequential circuit and a combinational circuit are freely placed on the chip. A clock phase number is also distributed, as necessary, by using the tree structure.

Another master slice type semiconductor integrated circuit is disclosed in Japanese Laid Open Patent Application (JP-A-Heisei 6-188397). FIG. 3 is a plan view showing a chip structure of the master slice type semiconductor integrated circuit disclosed in Japanese Laid Open Patent Application (JP-A-Heisei 6-188397). This semiconductor integrated circuit 201 has the structure in which an inner core area A is divided into a plurality of basic cell areas D by forming the inner core area A where basic cells are arranged as a matrix on a chip and further forming a cell area C dedicated to a sequential circuit. A clock buffer having high driving ability is formed in the cell area C dedicated to the sequential circuit, and the respective basic cells are formed adjacently to positions at which they can be connected at the shortest distance. Also, a combinational circuit besides the sequential circuit and the like are placed in an area E within the basic cell area D.

In the master slice type semiconductor integrated circuits shown in FIGS. 1 and 2, the sequential circuits are placed at random. Thus, the numbers of the sequential circuits connected to the respective clock buffers and the wiring lengths from the clock buffers to the sequential circuits are different, which brings about the situation that the load capacitance of the respective clock buffers and the wiring resistance until the respective sequential circuits are irregular. For this reason, the conventional semiconductor integrated circuit has a problem that a clock skew between the sequential circuits is large. In particular, if a large macro is placed, the clock wiring bypasses a macro area of the large macro. Hence, the irregular situation becomes more conspicuous. Also, since the transistor dimensions of the respective cells are equal to each other, a gate capacitance of a clock gate portion of the sequential circuit is larger than that of a block for a cell base, which results in a problem of an increase in an electric power consumption.

On the other hand, in the master slice type semiconductor integrated circuit shown in FIG. 3, the sequential circuits are collectively arranged in the dedicated area near a clock driver. Therefore, as the number of the sequential circuits is increased, the area for the sequential circuits is increased. Consequently, a distance between the nearest sequential circuit and the farthest sequential circuit is increased, which brings about a severe influence caused by a wiring resistance, which results in a problem that a clock skew between the sequential circuits becomes larger. In particular, as the size of the sequential circuits in the entire circuit becomes larger, the clock skew is increased. Also, if the number of the sequential circuits is known in advance in the custom design, the sequential circuits can be uniformly assigned to the respective clock buffers. However, if the configuration shown in FIG. 3 is applied to a design of the semi-custom semiconductor integrated circuit such as a gate array, it is difficult to uniformly assign the sequential circuits to the respective clock buffers. If the sequential circuits are excessively assigned in anticipation of a margin, load capacitance (wiring capacitance and gate capacitance) of the clock buffer is increased, which results in a problem of an increase in the electric power consumption. Also, if trying to cope with a poliphase clock, it is difficult to establish the area dedicated to the sequential circuit. Moreover, the uselessness of the electric power consumption becomes large.

As the related art, Japanese Laid Open Patent Application (JP-A-Heisei 6-244282) discloses a technique for attaining an extremely small clock skew, in a semiconductor integrated circuit apparatus having a clock synchronization circuit that is highly integrated and made into a large scale. In this semiconductor integrated circuit apparatus, a clock driver for outputting a clock signal and a plurality of grid-shaped wiring structures are connected such that their wiring lengths are equal, and a low order clock tree structure composed of slave buffers, flip-flops and the like are connected in a grid-shaped wiring structure. Consequently, it is possible to suppress even the clock skew between the grid-shaped wiring structures, simultaneously with the clock skew within the grid-shaped wiring structure. Thus, the clock skew in a large area can be reduced.

Japanese Laid Open Patent Application (JP-A-Heisei 10-308450) discloses a semiconductor integrated circuit that can cancel out a delay time difference (a skew) between flip-flops to which a clock signal of a gated clock circuit to suppress an electric power consumption of a clock line is supplied, and a method of designing the same. This semiconductor integrated circuit is the gated clock circuit having a clock tree structure constituted by a combination of a route buffer, a plurality of stages of buffers sequentially branched from the route buffer and final stage multi-input gates (NOR gates). Its connection relation is established after the arrangements of all cells. Also, after the flip-flops connected to the clock line are clustered for each function, the clustering is further carried out between the nearby flip-flops arranged in the neighborhood. Consequently, the loads, which are driven by the respective buffers and the multi-input gates, become constant. This design can cancel out the skew.

Japanese Laid Open Patent Application (JP-A-Heisei 11-111850) discloses a clock supplying circuit having a configuration that can easily reduce the clock skew, and its layout method and a semiconductor integrated circuit apparatus. The clock supplying circuit includes a first buffer element in which an input terminal is connected to a clock signal source terminal and a second buffer element in which an output terminal is connected to clock input terminals of flip-flops (FFs), and a clock signal is supplied to the respective flip-flops. The first and second buffer elements are connected to each other through a third buffer element without any branch. The third buffer element is placed at a position at which a wiring length between the first and second buffer elements is defined so as to reduce the clock skew, in view of the layout.

Also, Japanese Laid Open Patent Application (JP-A-Showa 62-4343) discloses a master slice type semiconductor integrated circuit apparatus, in which processes except a wiring process are commonly carried out, and various logic circuits are constituted by changing only the wiring step. In this master slice type semiconductor integrated circuit apparatus, the particular logic circuit is installed in the particular area of the inner cell areas constituting the various logic circuits.

Moreover, Japanese Laid Open Patent Application (JP-A 2000-294651) discloses a clock skew layout method. In this method, a plurality of local buffers are arranged around the global buffer to which a clock signal is supplied. Moreover, flip-flops constituting registers are arrayed on bars (wiring) crossing wiring extending by the same distance in a plurality of directions from the local buffer. Thus, transmission delay times can be uniformed to thereby reduce the clock skew.

SUMMARY OF THE INVENTION

The present invention is accomplished in view of the above mentioned problems. Therefore, an object of the present invention is to provide a master slice type semiconductor integrated circuit that can cope with a poliphase clock and reduce a clock skew between circuits.

Another object of the present invention is to provide a master slice type semiconductor integrated circuit that can reduce electric power consumption.

A semiconductor integrated circuit of the present invention includes sequential circuit cells (2) and combinational circuit cells (3), which are alternately arranged in an inner core area on a semiconductor chip, and a plurality of selective driving elements (MC101 to MC108, MC201 to MC216 and MC301 to MC316), which are connected in a shape of a tree, for selectively distributing a poliphase clock signal for each division area after the inner core area is uniformly divided. The plurality of selective driving elements (MC101 to MC108, MC201 to MC216 and MC301 to MC316) are placed and connected on the semiconductor chip (1) such that load and wiring length between the sequential circuit cells (2) within the respective division areas and input terminals to which the poliphase clock signal is inputted are equal to each other.

Also, in one configuration example of the semiconductor integrated circuit in the present invention, the sequential circuit cell includes: a first logical gate element (INV2) placed at a first stage of a clock input portion to which the poliphase clock signal is inputted; and a second logical gate element (INV3) placed immediately after this first logical gate element, and wherein for a sequential circuit cell to be used in the sequential circuit cells, a wiring for a connection is laid between an output terminal of the first logical gate element and an input terminal of the second logical gate element, and for a sequential circuit cell to be not used in the sequential circuit cells, the wiring is not laid between the output terminal of the first logical gate element and the input terminal of the second logical gate element, and the input terminal of the second logical gate element is connected to a power supply or a ground.

Also, in one configuration example of the semiconductor integrated circuit in the present invention, the sequential circuit cell includes: a first logical gate element (NAND1), which is placed at the first stage of the clock input portion to which the poliphase clock signal is inputted, for enabling a first state at which an output potential is determined based on the poliphase clock signal or a second state at which the output potential is constant irrespectively of the poliphase clock signal to be selected through an enable signal; and a second logical gate element (INV3) in which an input terminal is connected to an output terminal of the first logical gate element, and wherein for a sequential circuit cell to be used in the sequential circuit cells, the enable signal is set such that the first logical gate element becomes at the first state, and for a sequential circuit cell to be not used in the sequential circuit cells, the enable signal is set such that the first logical gate element becomes at the second state.

Also, in one configuration example of the semiconductor integrated circuit in the present invention, when the sequential circuit cell placed in the each division area to which the poliphase clock signal is distributed by one selective driving element of the plurality of selective driving elements, or the sequential circuit cell placed in the division area to which the poliphase clock signal is distributed by the one selective driving element through a different selective driving element is not used, an output of the one selective driving element is prevented.

A layout method of a semiconductor integrated circuit in the present invention includes the steps of: arranging sequential circuit cells and combinational circuit cells in an inner core area on a semiconductor chip; and arranging and connecting, in a shape of a tree, a plurality of selective driving elements for selectively distributing a poliphase clock signal for each division area formed by uniformly dividing said inner core area, wherein the plurality of selective driving elements are arranged and connected on the semiconductor chip such that load and wiring length between the sequential circuit cells within the respective division areas from input terminals to which the poliphase clock signal is inputted are equal to each other.

Also, in one configuration example of a layout method of a semiconductor integrated circuit in the present invention, wherein each of the sequential circuit cell is formed at a situation that a wiring is not laid between a first logical gate element placed at a first stage of a clock input to which the poliphase clock signal is inputted and a second logical gate element placed immediately after this first logical gate element, and wherein for a sequential circuit cell to be used in the sequential circuit cells, an output terminal of the first logical gate element and an input terminal of the second logical gate element are connected to each other at an arrangement wiring step, and for a sequential circuit cell to be not used in the sequential circuit cells, the wiring is not laid between the output terminal of the first logical gate element and the input terminal of the second logical gate element, and the input terminal of the second logical gate element is wired and connected to a power supply or a ground at the arrangement wiring step.

Also, in one configuration example of a layout method of a semiconductor integrated circuit in the present invention, the sequential circuit cell includes: a first logical gate element, which is placed at the first stage of the clock input to which the poliphase clock signal is inputted, for enabling a first state at which an output potential is determined on the basis of the poliphase clock signal or a second state at which the output potential is constant irrespectively of the poliphase clock signal to be selected through an enable signal; and a second logical gate element in which an input terminal is connected to an output terminal of the first logical gate element, and wherein for a sequential circuit cell to be used in the sequential circuit cells, a value of the enable signal is set such that the first logical gate element becomes at the first state, in an arrangement wiring step, and for a sequential circuit cell to be not used in the sequential circuit cells, a value of the enable signal is set such that the first logical gate element becomes at the second state, in the arrangement wiring step.

Also, in one configuration example of a layout method of a semiconductor integrated circuit in the present invention, when the sequential circuit cell placed in the division area to which the poliphase clock signal is distributed by one selective driving element of the plurality of selective driving elements, or the sequential circuit cell placed in the division area to which the poliphase clock signal is distributed by the one selective driving element through a different selective driving element is not used, an output of the one selective driving element is prevented.

BRIEF DESCRIPTION OF THE DRAWINGS

FIG. 9 is a view showing a relation between a control signal of a multiplexer having high driving ability for clock distribution and a clock signal distributed to each area on a chip;

DESCRIPTION OF THE PREFERRED EMBODIMENTS

[First Embodiment]

Figure 1B:
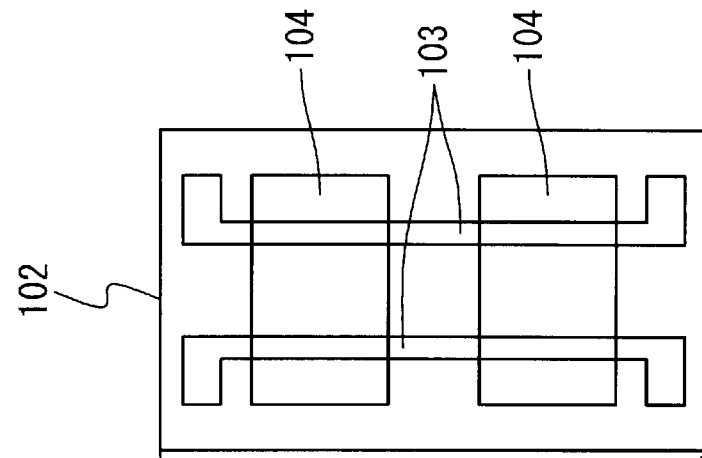
FIG. 1B is a plan view in which a transistor cell of the semiconductor integrated circuit is enlarged.
Figure 1A:
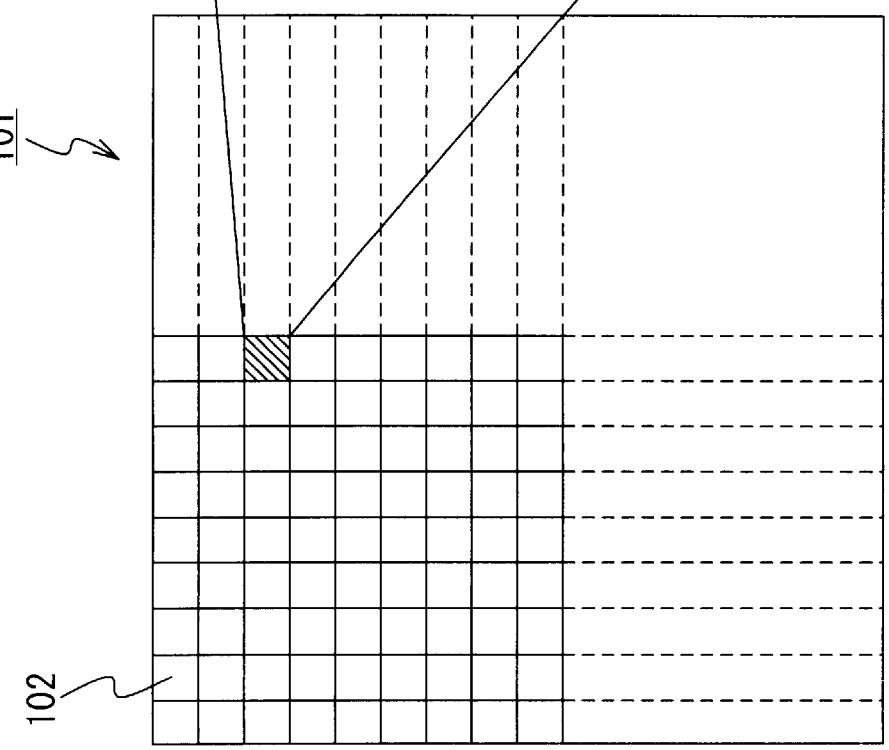
FIG. 1A is a plan view showing a chip structure of a conventional master slice type semiconductor integrated circuit.
Figure 2:
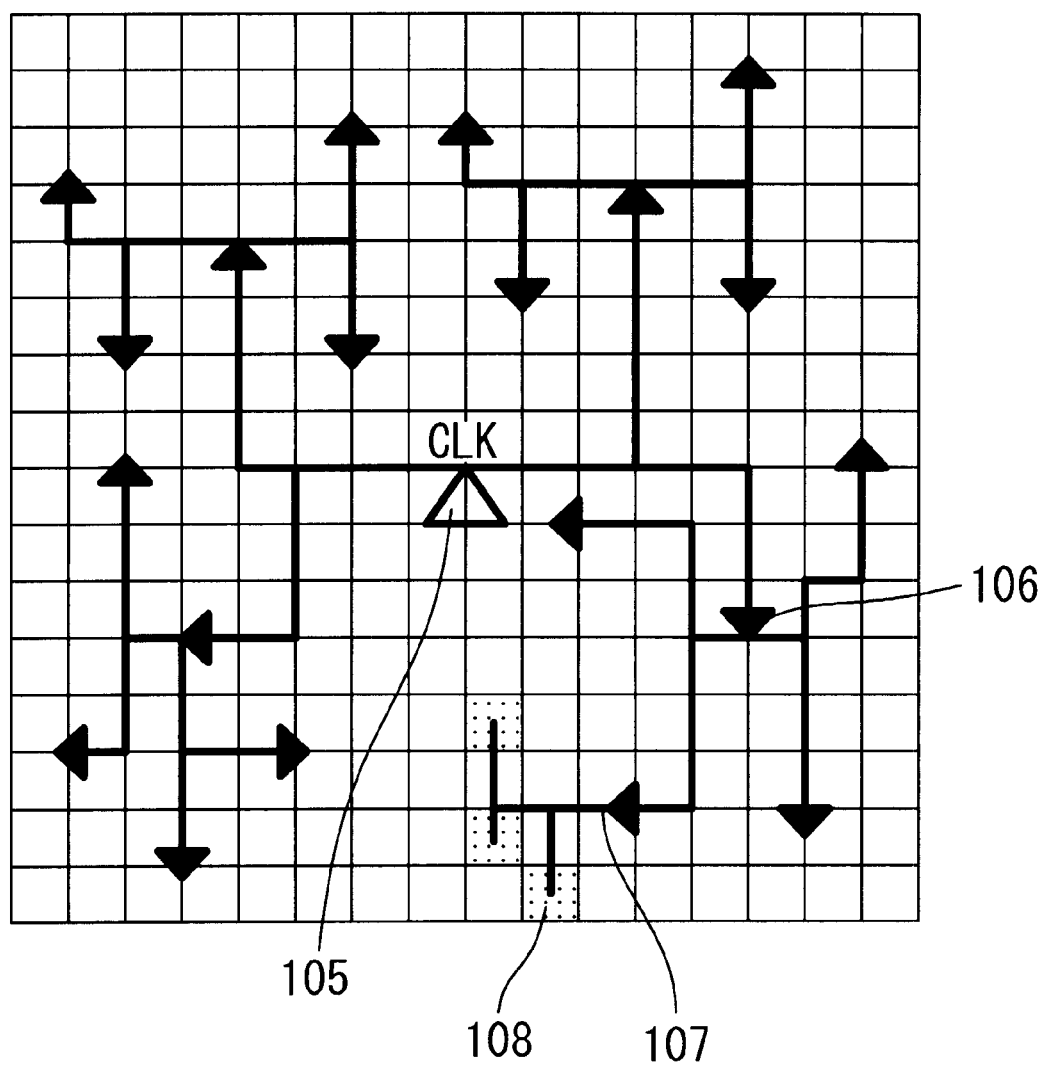
FIG. 2 is a plan view showing a clock distributing method in the conventional master slice type semiconductor integrated circuit.
Figure 3:
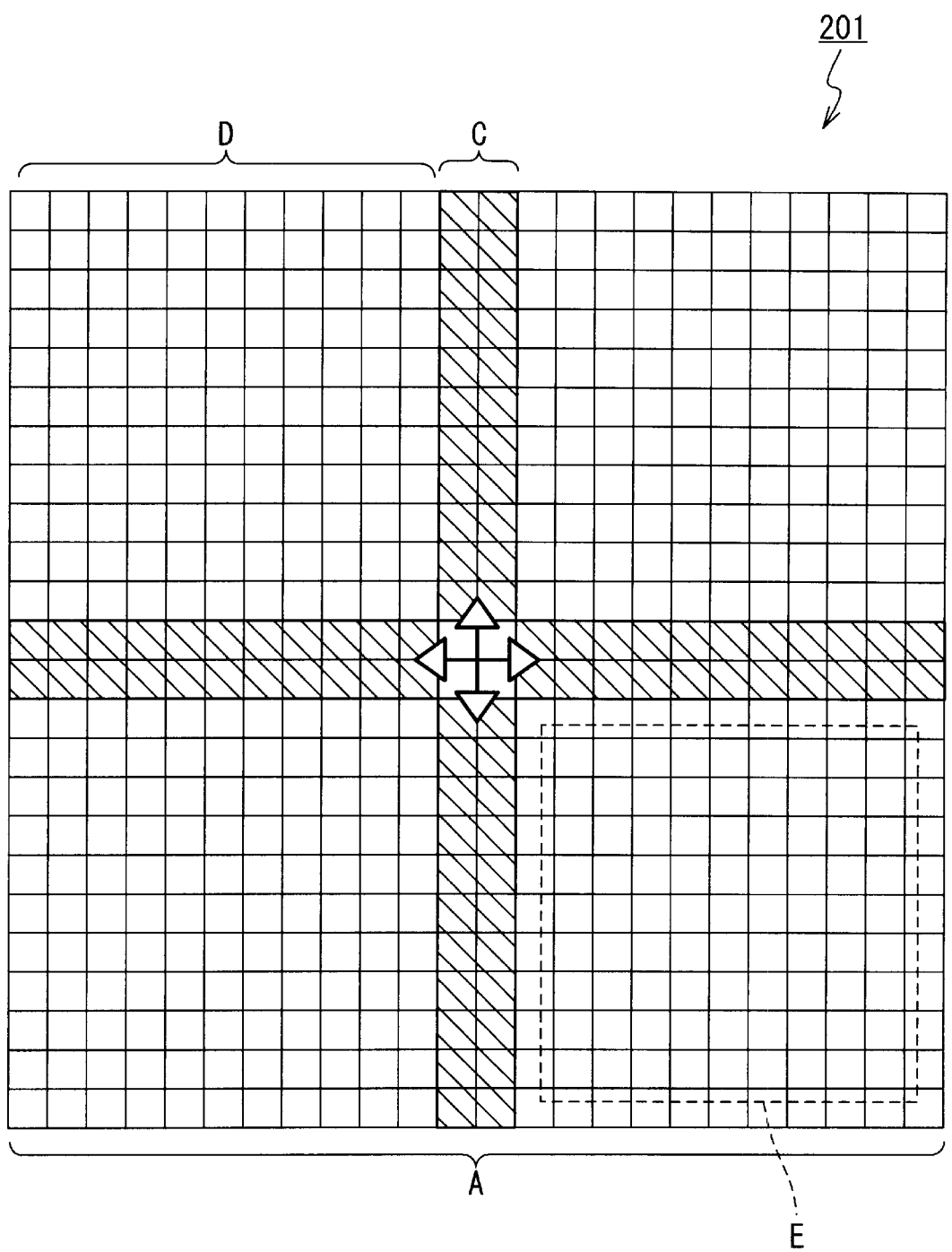
FIG. 3 is a plan view showing a chip structure of another conventional master slice type semiconductor integrated circuit.
Figure 4:
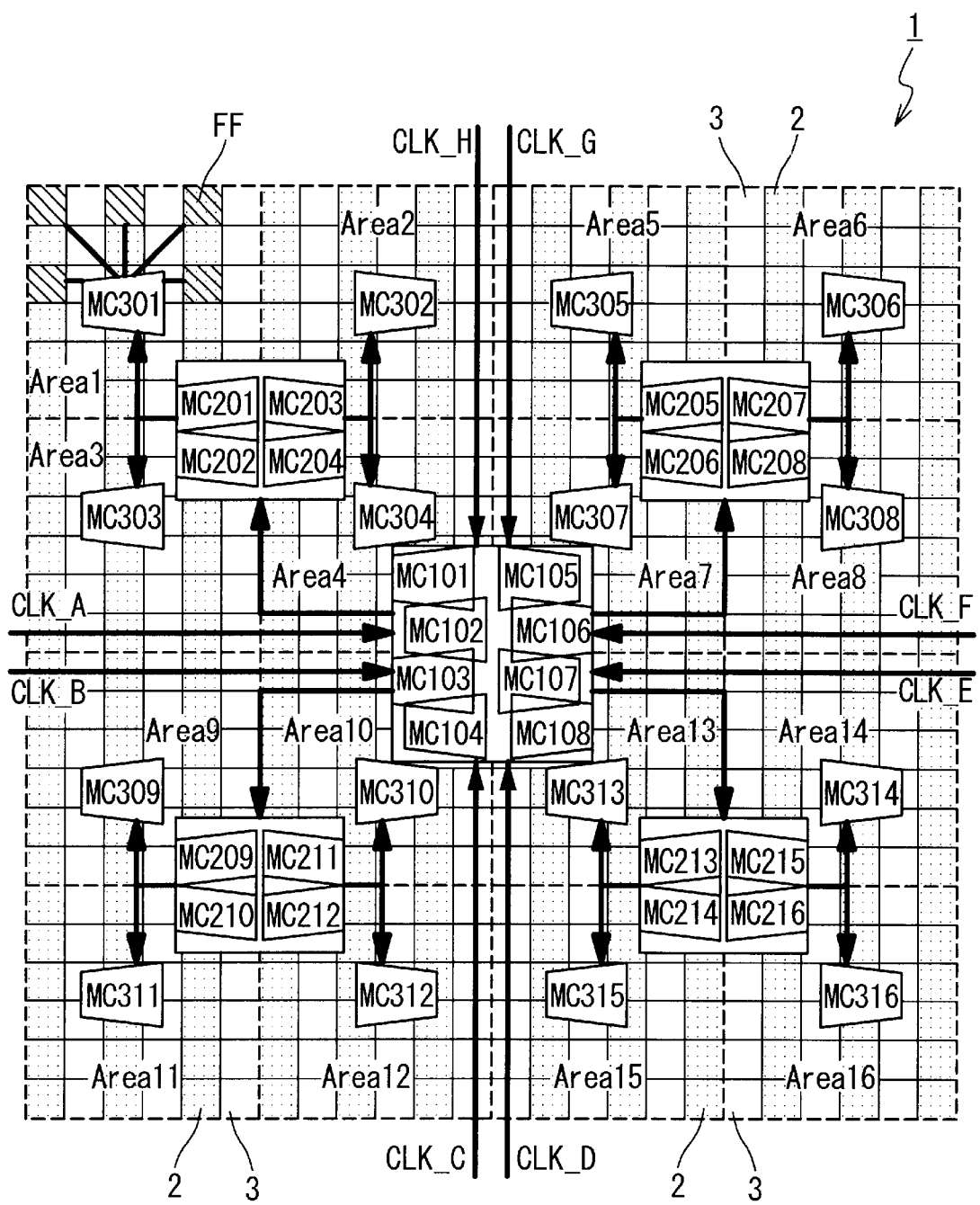
FIG. 4 is a plan view showing a chip structure of a master slice type semiconductor integrated circuit according to a first embodiment of the present invention.
Figure 5:
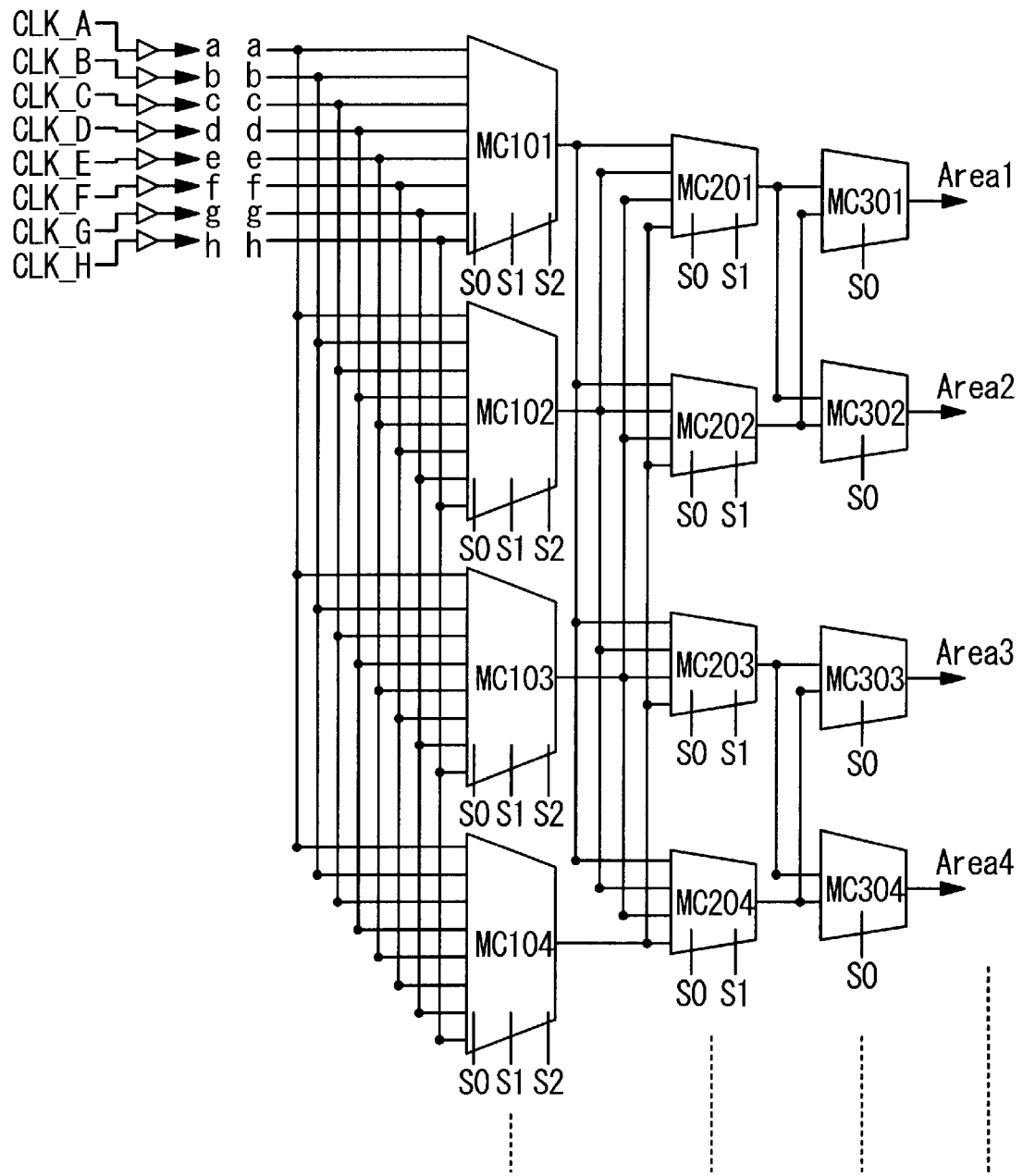
FIG. 5 is a circuit diagram showing a part of a circuit configuration of a clock tree structure according to the first embodiment of the present invention.
Figure 6:
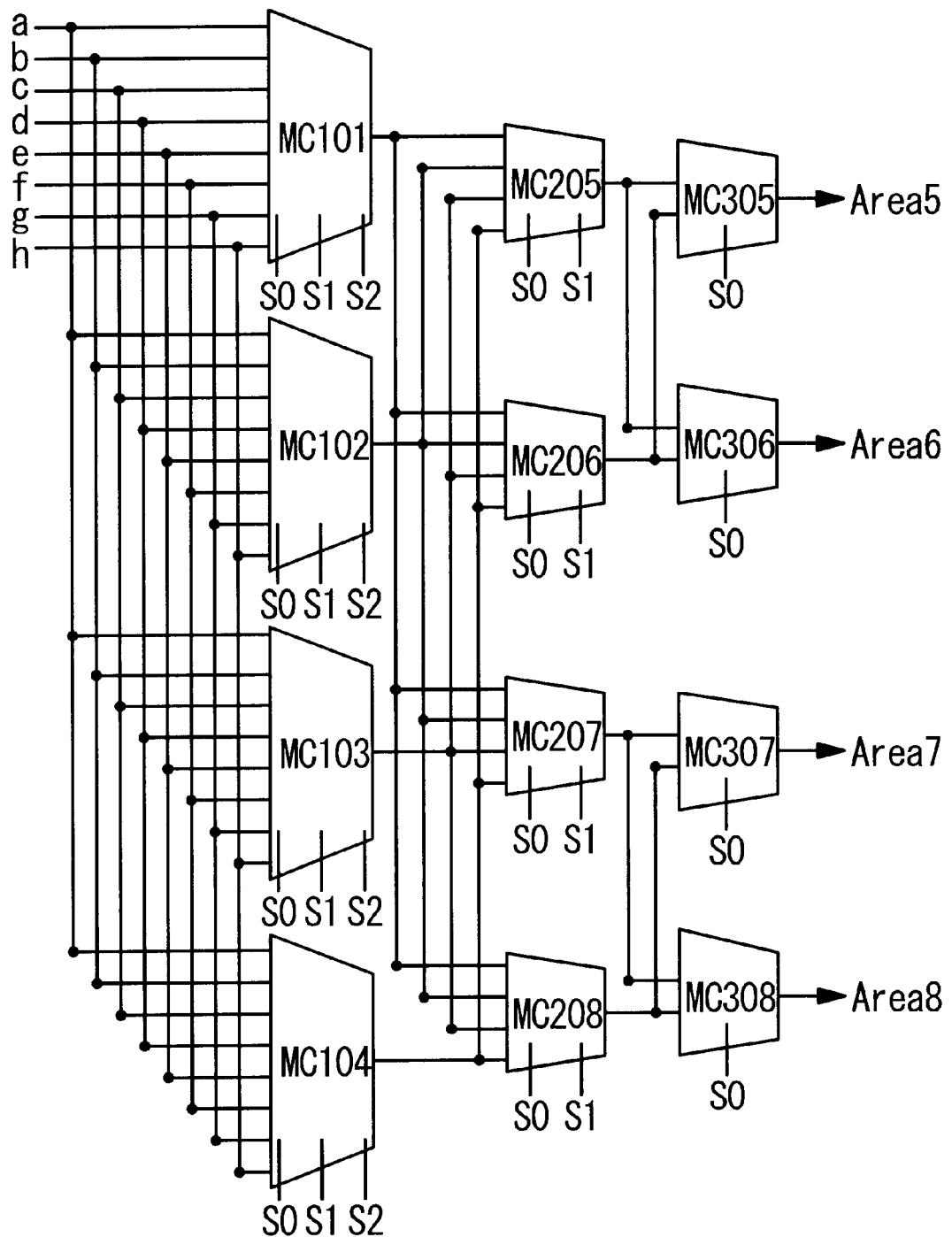
FIG. 6 is a circuit diagram showing another part of the circuit configuration of the clock tree structure according to the first embodiment of the present invention.
Figure 7:
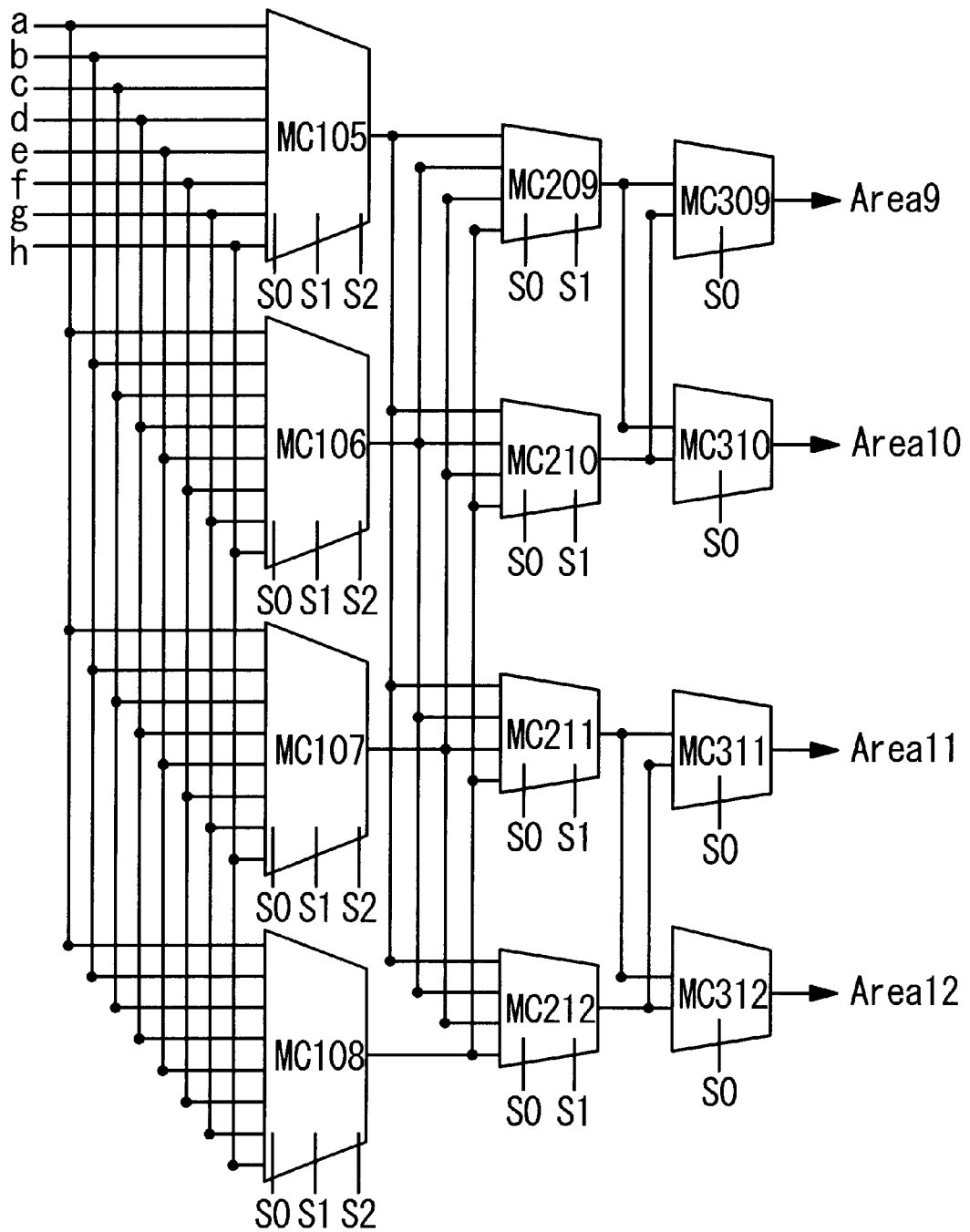
FIG. 7 is a circuit diagram showing still another part of the circuit configuration of the clock tree structure according to the first embodiment of the present invention.
Figure 8:
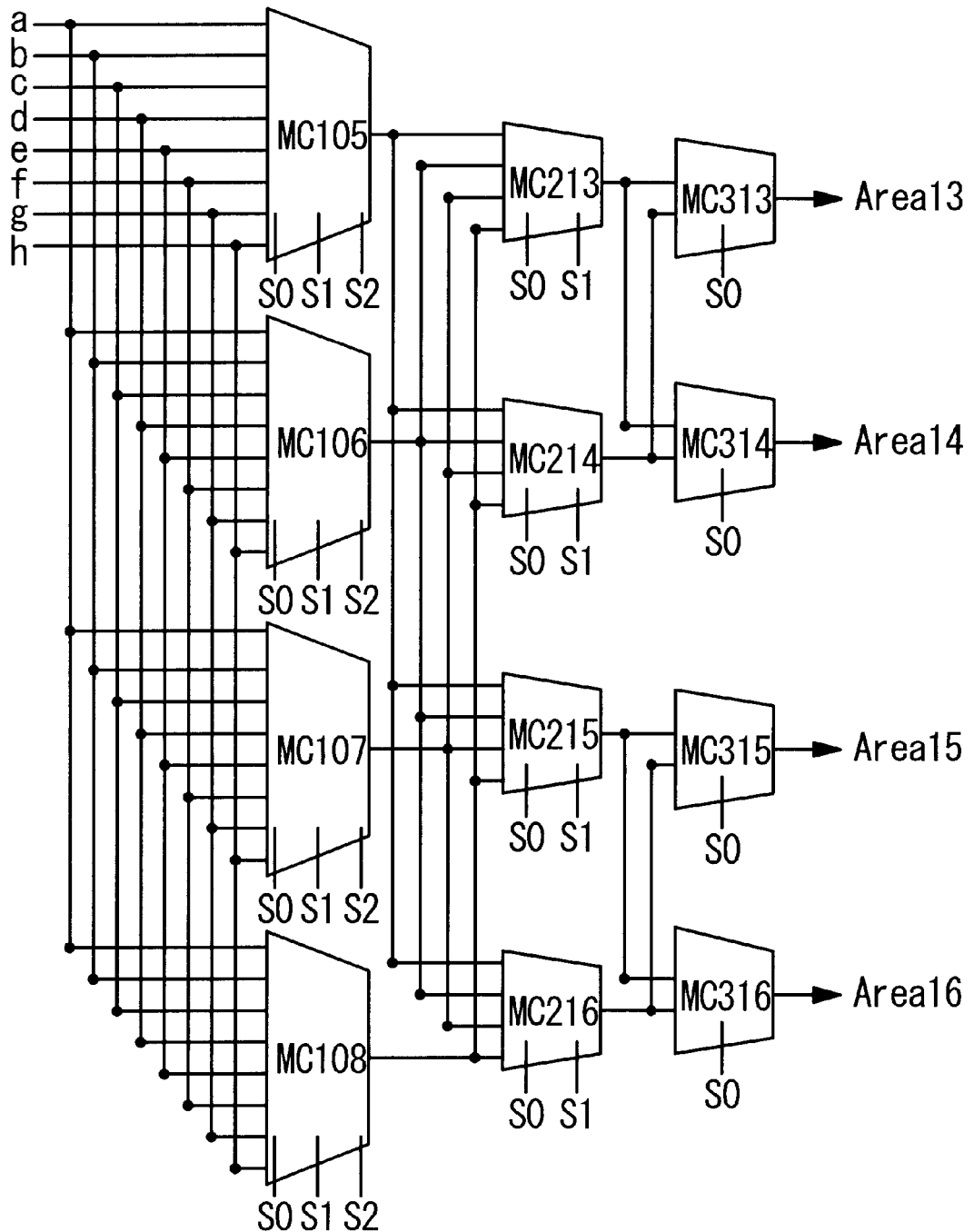
FIG. 8 is a circuit diagram showing still another part of the circuit configuration of the clock tree structure according to the first embodiment of the present invention.

A first embodiment of the present invention will be described below with reference to the attached drawings. FIG. 4 is a plan view showing a chip structure of a master slice type semiconductor integrated circuit according to the fist embodiment of the present invention. In the master slice type semiconductor integrated circuit 1 in this embodiment, sequential circuit cells 2, in which each output is determined not only by a present input but also by a past history of the input, and combinational circuit cells 3, in which each output is determined only by the present input, are alternately arranged in an inner core area on a semiconductor chip.

Moreover, in this first embodiment, as shown in FIG. 4, the inner core area is divided into 16 division areas of Area1, Area2, Area3, Area4, Area5, Area6, Area7, Area8, Area9, Area10, Area11, Area12, Area13, Area14, Area15 and Area16. Each of these division areas has substantially equal size to each other.

In order to selectively distribute poliphase clock signals CLK_A, CLK_B, CLK_C, CLK_D, CLK_E, CLK_F, CLK_G and CLK_H to the respective division areas Area1 to Area16, clock tree structures that are equal in load and wiring length are formed which use multiplexers MC101 to MC108, MC201 to MC216 and MC301 to MC316 for clock distribution, each of the multiplexer has high driving ability. The multiplexers MC101 to MC108, MC201 to MC216 and MC301 to MC316 select any one from a plurality of inputs to output it.

The clock tree structure is generally formed in advance without depending on which sequential circuit cell 2 is used for each design. For example, as shown in FIG. 4, the multiplexers MC101 to MC108 are arranged on the center of the chip, the multiplexers MC201 to MC204 are respectively arranged on the center of the four division areas Area1 to Area4, the multiplexers MC205 to MC208 are respectively arranged on the center of the four division areas Area5 to Area8, the multiplexers MC209 to MC212 are respectively arranged on the center of the four division areas Area9 to Area12, and the multiplexers MC213 to MC216 are respectively arranged on the center of the four division areas Area13 to Area16. Moreover, the multiplexers MC301 to MC316 are arranged in the vicinities of the respective centers of the division areas Area1 to Area16, one by one.

FIGS. 5 to 8 are the circuit diagramss showing the circuit configuration of the clock tree structure. The poliphase clock signals CLK_A to CLK_H are commonly distributed to the multiplexers MC101 to MC108 from an external portion. The respective outputs of the multiplexers MC101 to MC104 are commonly distributed to the multiplexers MC210 to MC208. The respective outputs of the multiplexers MC105 to MC108 are commonly distributed to the multiplexers MC209 to MC216.

Moreover, the respective outputs of the multiplexers MC201 and MC202 are commonly distributed to the multiplexers MC301 and MC302, the respective outputs of the multiplexers MC203 and MC204 are commonly distributed to the multiplexers MC303 and MC304, the respective outputs of the multiplexers MC205 and MC206 are commonly distributed to the multiplexers MC305 and MC306, the respective outputs of the multiplexers MC207 and MC208 are commonly distributed to the multiplexers MC307 and MC308, the respective outputs of the multiplexers MC209 and MC210 are commonly distributed to the multiplexers MC309 and MC310, the respective outputs of the multiplexers MC211 and MC212 are commonly distributed to the multiplexers MC311 and MC312, the respective outputs of the multiplexers MC213 and MC214 are commonly distributed to the multiplexers MC313 adn MC314, and the respective outputs of the multiplexers MC215 and MC216 are commonly distributed to the multiplexers MC315 and MC316.

The output of the multiplexer MC301 is distributed to the sequential circuit cell 2 in the division area Area1. In FIG. 4, the output of the multiplexer MC301 is distributed to the flip-flops (FFs). Similarly, the outputs of the multiplexers MC302 to MC316 are distributed to the sequential circuit cells 2 in the division areas Area2 to Area16, respectively.

The respective wiring through which the poliphase clock signals CLK_A to CLK_H are supplied to the multiplexers MC101 to MC108 from the external portion are arranged such that the wiring lengths until the multiplexers MC101 to MC108 are equal to each other. The respective wiring through which the outputs of the multiplexers MC101 to MC108 are supplied to the multiplexers MC201 to MC216 are arranged such that the wiring lengths until the multiplexers MC201 to MC216 are equal to each other.

Also, the respective wiring through which the outputs of the multiplexers MC201 to MC216 are supplied to the multiplexers MC301 to MC316 are arranged such that the wiring lengths until the multiplexers MC301 to MC316 are equal to each other. Moreover, the respective wiring through which the outputs of the multiplexers MC301 to MC316 are supplied to the sequential circuit cells 2 are arranged such that the wiring lengths until the sequential circuit cells 2 are equal to each other.

Three control signals S0, S1 and S2 are supplied from an external portion to the multiplexers MC101 to MC108. The two control signals S0, S1 are supplied to the multiplexers MC201 to MC216, and the control signal S0 is supplied to the multiplexers MC301 to MC316. It should be noted that, if the symbol of the control signal is changed for each multiplexer, the figure space required to draw it is largely increased. Thus, in FIGS. 5 to 8, they are represented by only the three control signals S0, S1 and S2. However, the control signals S0, S1 and S2 are different for each multiplexer.

The operation of the clock tree structure of the semiconductor integrated circuit in this first embodiment will be described below. In this first embodiment, the poliphase clock signals CLK_A to CLK_H can be selectively distributed to the respective division areas Area1 to Area16 through the multiplexers MC101 to MC108, MC201 to MC216 and MC301 to MC316.

FIG. 9 is a view showing the relation between the control signals S0, S1 and S3 of the multiplexers MC101 to MC108, MC201 to MC216 and MC301 to MC316 for the clock distribution and the clock signals distributed to the respective division areas Area1 to Area16 on the chip. However, FIG. 9 illustrates only the control signals S0, S1 and S3 of the multiplexers MC101 to MC104, MC201 to MC204 and MC301 to MC304 and the clock signals distributed to the division areas Area1 to Area4.

The multiplexers MC101 to MC108 select and output the clock signal CLK_A when the control signals S0, S1 and S3 are at "000". Similarly, the multiplexers MC101 to MC108 select and output the clock signal CLK_B when the control signals S0, S1 and S3 are at "001", select and output the clock signal CLK_C when they are at "010", select and output the clock signal CLK_D when they are at "011", select and output the clock signal CLK_E when they are at "100", select and output the clock signal CLK_F when they are at "101", select and output the clock signal CLK_G when they are at "110", and select and output the clock signal CLK_H when they are at "111".

The MC201 to MC216 select and output a first input when the control signals S0, S1 are at "00" (for example, in the case of the MC201, the output of the MC101). Similarly, the MC201 to MC216 select and output a second input when the control signals S0, S1 are at "01" (for example, in the case of the MC201, the output of the MC102), select and output a third input when they are at "10" (for example, in the case of the MC201, the output of the MC103), and select and output a fourth input when they are at "11" (for example, in the case of the MC201, the output of the MC104).

The MC301 to MC316 select and output a first input when the control signal S0 is at "0" (for example, in the case of the MC301, the output of the MC201), and select and output a second input when the control signal S0 is at "1" (for example, in the case of the MC301, the output of the MC202).

Thus, if the values of the control signals S0, S1 and S3 of the respective multiplexers MC101 to MC104, MC201 to MC204 and MC301 to MC304 are set as shown in FIG. 9, the clock signal CLK_A or CLK_C can be selectively distributed to the division areas Area1 and Area2, and the clock signal CLK_C or CLK_D can be selectively distributed to the division areas Area3 and Area4. The similar control can be performed on the other multiplexers MC105 to MC108, MC205 to MC216 and MC305 to MC316. Hence, the poliphase clock signals CLK_A to CLK_H can be selectively distributed to the division areas Area5 to Area6.

It should be noted that, which clock signal of the poliphase clock signals CLK_A to CLK_H is distributed to what number of the division area is determined by the specification of the semiconductor integrated circuit. Then, the settings of the control signals S0, S1 and S3 are carried out in the wiring step performed after the sequential circuit cell 2 and the combinational circuit cell 3 are formed on the chip. That is, a wiring pattern connected to a power supply is formed for the control signal for setting the value to "1", and a wiring pattern connected to a ground is formed for the control signal for setting the value to "0".

Figure 10A:
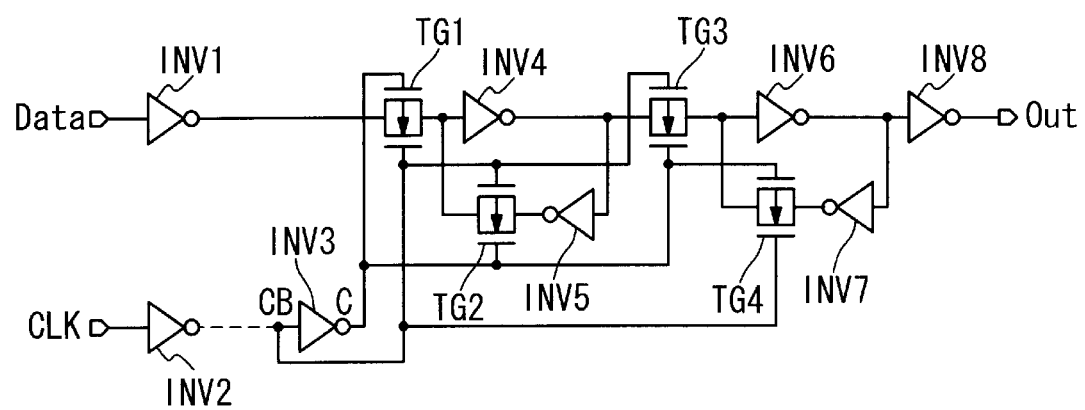
FIG. 10A is a circuit diagram showing a configuration example of a sequential circuit cell in the first embodiment of the present invention.
Figure 10B:
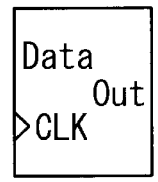
FIG. 10B is a view showing circuit symbols of the sequential circuit cell shown in FIG. 10A.

Next, the process of the non-used excessive sequential circuit cell 2 will be described below. FIG. 10A is a circuit diagram showing a configuration example of the sequential circuit cell 2, and FIG. 10B is a view showing the circuit symbols of the sequential circuit cell 2. The sequential circuit cell 2 shown in FIGS. 10A and 10B is a D-type flip-flop, and it is composed of inverters INV1 to INV8, and transmission gates TG1 to TG4.

In this embodiment, it is designed such that the wiring is not laid between an output terminal of a first stage gate (the inverter INV2) of a clock input portion of each sequential circuit cell 2 and an input terminal (the inverter INV3) of the next stage gate (the portion indicated by a dashed line of FIG. 10A), at the step of forming the sequential circuit cells 2 and the combinational circuit cells 3 on the chip.

Whether or not sequential circuit cell 2 is used is different depending on the specification of the semiconductor integrated circuit. For a sequential circuit cell 2 to be used, a wiring pattern is formed for connecting the output terminal of the first stage gate INV2 of the clock input portion and the input terminal of the next stage gate INV3 at the arrangement wiring step. On the other hand, for a sequential circuit cell 2 to be not used, the wiring is not laid between the output terminal of the first stage gate INV2 of the clock input and the input terminal of the next stage gate INV3, and a wiring pattern for connecting an input terminal CB of the next stage gate INV3 to the power supply or the ground is formed at the arrangement wiring step.

Figure 11A:
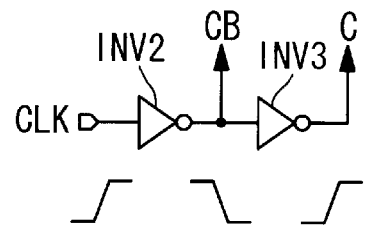
FIGS. 11A and 11B are views showing an operation of a clock input portion of the sequential circuit cell in the first embodiment of the present invention.
Figure 11B:
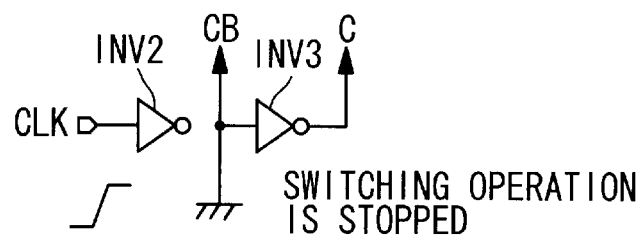

As a result, in the clock input portion of the sequential circuit cell 2 to be used, potentials of the input terminal CB and an output terminal C of the next stage gate INV3 are changed on the basis of the clock signals CLK (CLK_A to CLK_H), as shown in FIG. 11A. On the other hand, in the clock input portion of the sequential circuit cell 2 to be not used, the potentials of the input terminal CB and the output terminal C of the next stage gate INV3 are not changed as shown in FIG. 11B. Therefore, a switching operation based on the clock signal CLK is not carried out.

The load of each of the multiplexers MC301 to MC316 is the first stage gate of the clock input portion of the sequential circuit cell 2. Thus, if the sequential circuit cells 2 are uniformly assigned to the respective multiplexers MC301 to MC316, the numbers of the gates connected to the respective multiplexers MC301 to MC316 are equal to each other. Hence, the loads of the respective multiplexers MC301 to MC316 can be made equal to each other without any generation of a floating gate.

Figure 12:
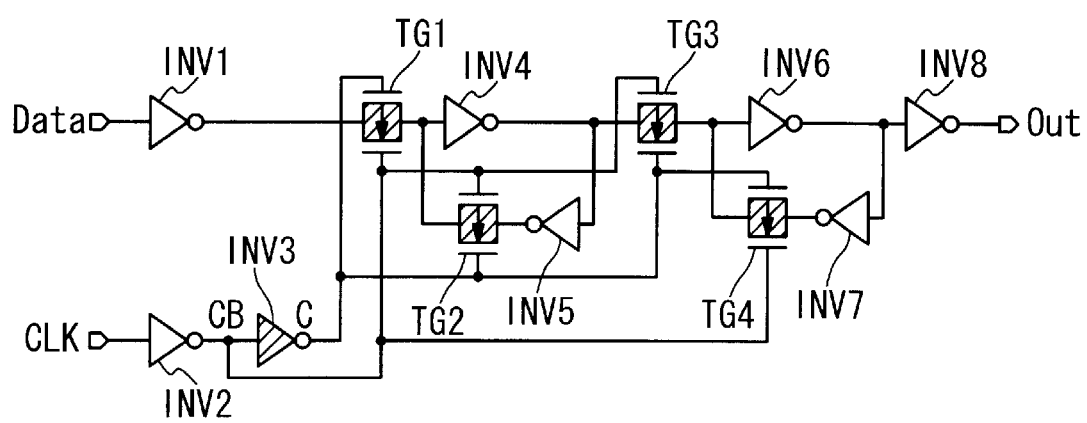
FIG. 12 is a view showing a non-load transistor of an excessive sequential circuit cell in the first embodiment of the present invention.

Also, in this first embodiment, it is designed such that the wiring is not laid between the output terminal of the first stage gate of the clock input portion of the excessive sequential circuit cell 2 to be not used and the input terminal of the next stage gate. Thus, in this excessive sequential circuit cell 2, the inverter INV3 and the transmission gates TG1 to TG4, on which the oblique lines of FIG. 12 are drawn, become the non-load transistors. Hence, the electric power consumption can be reduced over the conventional semiconductor integrated circuit in which all of the sequential circuit cells become the loads irrespectively of their usage.

It should be noted that, in this first embodiment, it is designed such that the number of the phases of the clock signals is eight, the numbers of the input signals of the multiplexers MC101 to MC108, MC201 to MC216 and MC301 to MC316 are eight, four and two, respectively, the number of the clock tree stages is three and the number of the division areas on the chip is sixteen. Of course, their numbers are not limited to the above-mentioned values. Also, in this first embodiment, all of the clock trees are constituted by using the multiplexers. However, they are not limited to the multiplexers. A part of them may be a clock buffer, instead of the multiplexer.

Also, in this first embodiment, the sequential circuit cells 2 and the combinational circuit cells 3 are alternately arranged for each row. However, the sequential circuit cells 2 and the combinational circuit cells 3 may be alternately arranged for each line. Also, the sequential circuit cells 2 and the combinational circuit cells 3 may be checker-wise arranged. The reason why the sequential circuit cells 2 and the combinational circuit cells 3 are alternately arranged is to uniformly arrange the sequential circuit cells 2 within the division area and thereby make the wiring lengths from the multiplexer equal to each other.

[Second Embodiment]

Figure 13A:
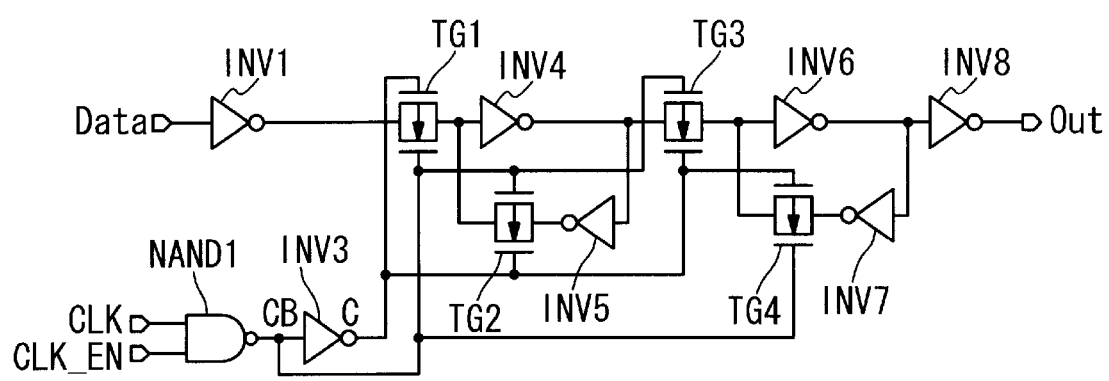
FIG. 13A is a circuit diagram of a sequential circuit cell according to a second embodiment of the present invention.
Figure 13B:
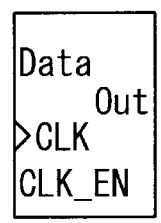
FIG. 13B is a view showing circuit symbols of the sequential circuit cell shown in FIG. 12A.

FIG. 13A is a circuit diagram of a sequential circuit cell 2 according to a second embodiment of the present invention, and FIG. 13B shows the circuit symbols of the sequential circuit cell 2 of FIG. 13A. The same reference symbols are given to the configuration portions similar to those of FIGS. 10A and 10B. The sequential circuit cell 2 shown in FIGS. 13A and 13B is a D-type flip-flop having an enable function, and it is provided with the inverters INV1, INV3 to INV8, the transmission gates TG1 to TG4, and a not AND gate NAND1.

In this second embodiment, differently from the first embodiment, it is designed such that an output terminal of a first stage gate NAND1 of the clock input portion in each sequential circuit cell 2 and an input terminal portion of the next stage gate INV3 are connected at the step of forming the sequential circuit cells 2 and the combinational circuit cells 3 on the chip. In the sequential circuit cell 2 to be used, a wiring pattern in which a clock enable signal CLK_EN is set at "1" (a wiring pattern connected to the power supply) is formed at the arrangement wiring step. In the excessive sequential circuit cell 2 to be not used, a wiring pattern in which the clock enable signal CLK_EN is set at "0" (a wiring pattern connected to the ground) is formed.

Figure 14A:
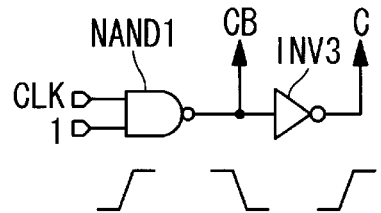
FIGS. 14A and 14B are views showing an operation of a clock input portion of the sequential circuit cell in the second embodiment of the present invention.
Figure 14B:
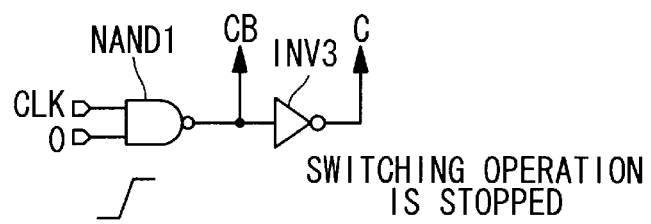

Consequently, in the clock input portion of the sequential circuit cell 2 to be used, the potentials of the input terminal CB and the output terminal C of the next stage gate INV3 are changed on the basis of the clock signals CLK (CLK_A to CLK_H), as shown in FIG. 14A. On the other hand, in the clock input portion of the sequential circuit cell 2 to be not used, the potentials of the input terminal CB and the output terminal C of the next stage gate INV3 are not changed as shown in FIG. 14B. In this case, the switching operation based on the clock signal CLK is not carried out.

Figure 15:
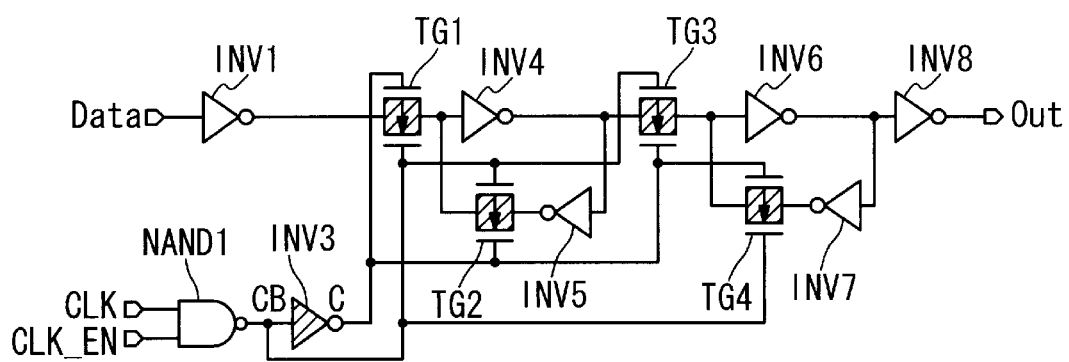
FIG. 15 is a view explaining a non-load transistor of an excessive sequential circuit cell in the second embodiment of the present invention.

As a result, in the non-used excessive sequential circuit cell 2, the inverter INV3 and the transmission gates TG1 to TG4, on which the oblique lines of FIG. 15 are drawn, become the non-load transistors. Thus, it is possible to obtain the effect of the low skew and the low electric power consumption, similarly to the first embodiment.

It should be noted that, in this second embodiment, the not AND gate is used for the first stage gate of the clock input portion. However, it is not limited the not AND gate. A NOR gate may be used. If the NOR gate is used, the clock enable signal CLK_EN may be set to "0" for the sequential circuit cell 2 to be used, and the clock enable signal CLK_EN may be set to "1" for the sequential circuit cell 2 to be not used. However, if it is necessary to make the phase of the clock equal to that of the sequential circuit cell 2 described in the first embodiment, it is necessary to install one stage of an inverter immediately before the clock input terminal of the not AND gate or at the output terminal.

[Third Embodiment]

In the semiconductor integrated circuit according to the first and second embodiments, within the non-used sequential circuit cell 2, the prevention of the transmission to the next stage gate (the inverter INV2) of the input clock signal stops the operation of the sequential circuit cell 2. On the contrary, in a semiconductor integrated circuit according to this third embodiment, the suppression of the outputs of the multiplexers constituting the clock tree structure stops the operations of all the sequential circuit cells 2 connected to the downstream side from the multiplexer.

Figure 17A:
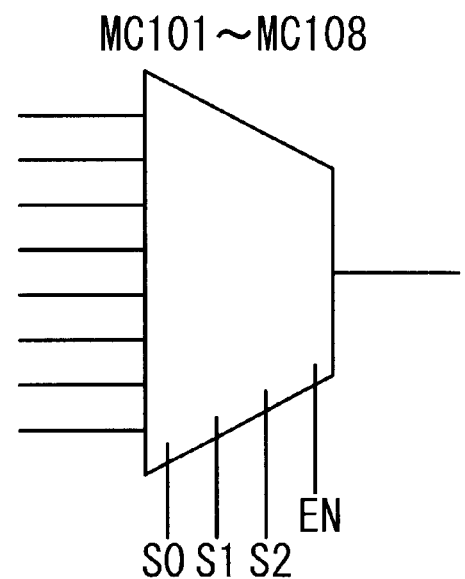
FIGS. 17A to 17C are views showing a configuration of a selector for stopping the operation of the excessive sequential circuit cell in the third embodiment of the present invention.
Figure 17B:
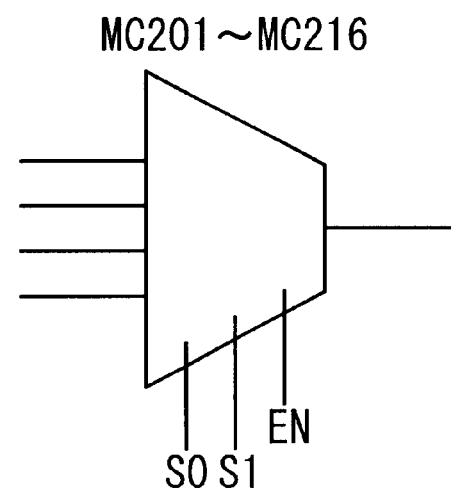
Figure 17C:
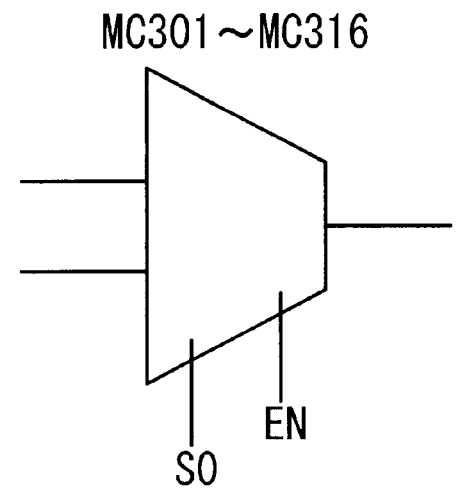

The multiplexer used for the clock distribution in this third embodiment is configured such that an enable terminal EN is added to the multiplexer used in the first and second embodiments, as shown in FIGS. 17A, 17B and 17C. This enable terminal EN is controlled in accordance with a stop condition.

FIG. 17A shows the multiplexer of eight inputs and one output, which has the enable terminal EN, and it is used as the multiplexers MC101 to MC108. This multiplexer selects and outputs any of the eight input signals in accordance with the control signals S0 to S2 if "1" is given to the enable terminal EN as the stop condition. On the other hand, if "0" is given to the enable terminal EN as the stop condition, it always outputs "0" irrespectively of the control signals S0 to S2.

FIG. 17B shows the multiplexer of four inputs and one output, which has the enable terminal EN, and it is used as the multiplexers MC201 to MC216. This multiplexer selects and outputs any of the four input signals in accordance with the control signals S0 and S1 if "1" is given to the enable terminal EN as the stop condition. On the other hand, if "0" is given to the enable terminal EN as the stop condition, it always outputs "0" irrespectively of the control signals S0 and S1.

FIG. 17C shows the multiplexer of two inputs and one output, which has the enable terminal EN, and it is used as the multiplexers MC301 to MC316. This multiplexer selects and outputs any of the two input signals in accordance with the control signal S0 if "1" is given to the enable terminal EN as the stop condition. On the other hand, if "0" is given to the enable terminal EN as the stop condition, it always outputs "0" irrespectively of the control signal S0.

Figure 16:
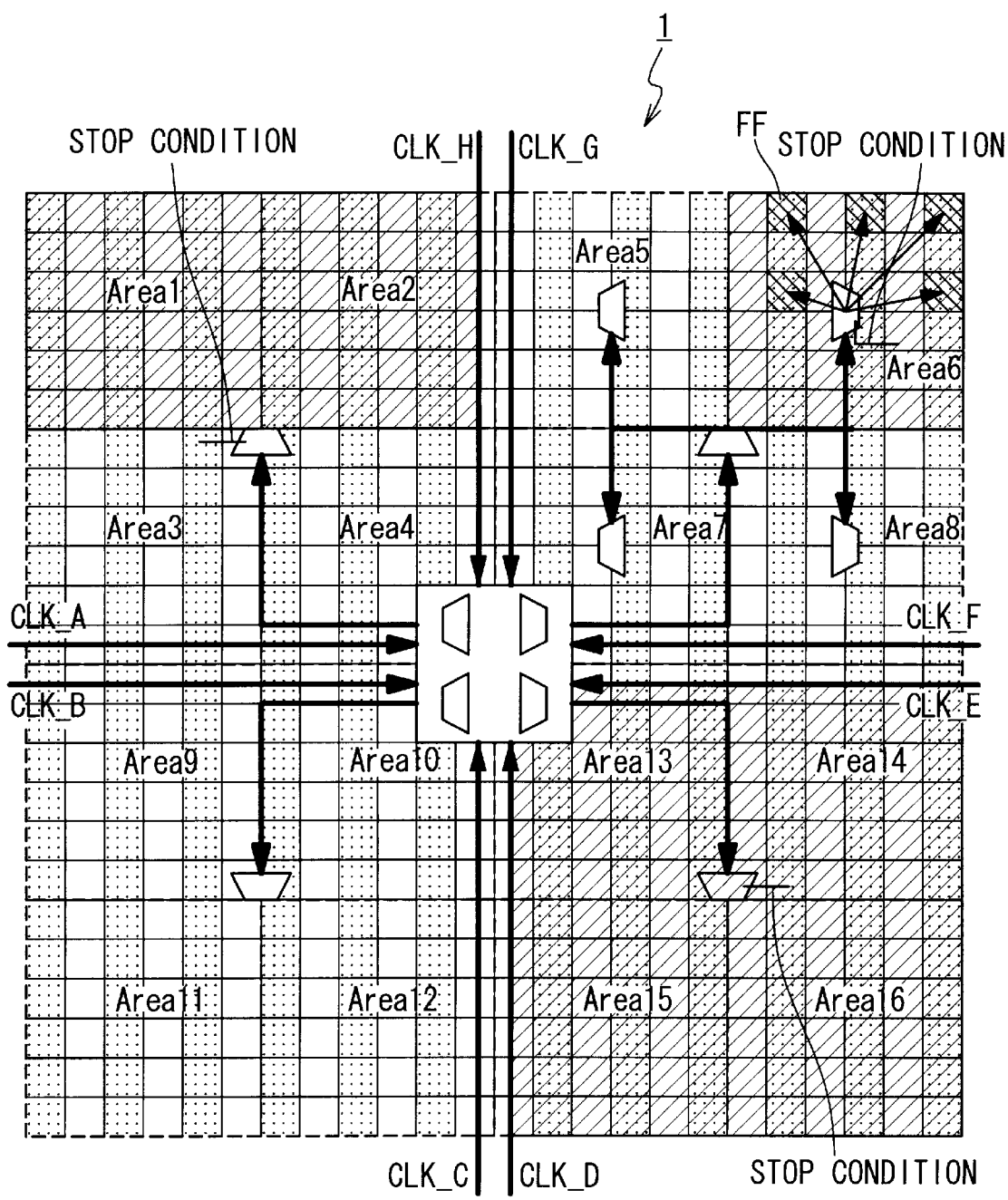
FIG. 16 is a view explaining a situation that an operation of an excessive sequential circuit cell is stopped in a third embodiment of the present invention.

Now, as shown in FIG. 16, let us suppose that all the sequential circuit cells 2 existing in the division areas Area1, Area2, and Area6, and Area13 to Area16 (the portions indicated by the oblique lines) are not used.

In this case, the outputs of the multiplexers MC201, MC202 for driving the sequential circuit cells 2 of the two division areas Area1 and Area2 are suppressed. This suppression is done by giving "0" to the enable terminals EN of the multiplexers MC201 and MC202 constituted as shown in FIG. 17B. Thus, the distribution of the clock signal to the division areas Area1 and Area2 is stopped. In other words, the switching of the clock signal is stopped to thereby stop the operations of all the sequential circuit cells 2 in those division areas Area1 and Area2. The operation similar to the above-mentioned operation can be carried out even by suppressing the outputs of the multiplexers MC301 and MC302.

Also, the output of the multiplexer MC306 for driving the sequential circuit cell 2 of one division area Area6 is suppressed. This suppression is done by giving "0" to the enable terminal EN of the multiplexer MC306 constituted as shown in FIG. 17C. Thus, the distribution of the clock signal to the division area Area6 is stopped. In other words, the switching of the clock signal is stopped to thereby stop the operations of all the sequential circuit cells 2 in this division area Area6.

Moreover, the outputs of the multiplexers MC213 to MC216 for driving the sequential circuit cells 2 of the tour division areas Area13 to Area16 are suppressed. This suppression is done by giving "0" to the enable terminals EN of the multiplexers MC213 to MC216 constituted as shown in FIG. 17B. Thus, the distribution of the clock signal to the division areas Area13 to Area16 is stopped. In other words, the switching of the clock signal is stopped to thereby stop the operations of all the sequential circuit cells 2 in those division areas Area13 to Area16. The operation similar to the above-mentioned operation can be carried out even by suppressing the outputs of the multiplexers MC313 to MC316.

It should be noted that, although not shown in FIG. 16, if all the sequential circuit cells 2 existing in the eight division areas Area1 to Area8 are assumed to be not used, the outputs of the multiplexers MC101 to MC104 for driving the sequential circuit cells 2 of the eight division areas Area1 to Area8 are suppressed. This suppression is done by giving "0" to the enable terminals EN of the multiplexers MC101 to MC104 constituted as shown in FIG. 17A. Thus, the distribution of the clock signal to the division areas Area1 to Area8 is stopped. In other words, the switching of the clock signal is stopped to thereby stop the operations of all the sequential circuit cells 2 in those division areas Area1 to Area8. In this case, the operation similar to the above-mentioned operation can be carried out even by suppressing the outputs of the multiplexers MC201 to MC208 or the multiplexers MC301 to MC308.

Whether "1" or "0" is set as the stop condition of the enable terminals EN of the respective multiplexers MC101 to MC108, MC201 to MC216 and MC301 to MC316 is determined on the basis of the specification of the semiconductor integrated circuit. Then, the enable terminal EN is set at the wiring step after the sequential circuit cells 2 and the combinational circuit cells 3 are formed on the chip.

That is, whether or not there is the division area in which any one of the sequential circuit cells 2 is not used is checked after the completion of the arranging step. If it is judged that there is the division area in which any one of the sequential circuit cells 2 is not used, the enable terminal EN of the multiplexer for distributing the clock signal to the division area is set to "0".

In the example shown in FIG. 16, it is judged that any one of the sequential circuit cells 2 is not used in the division area Area6. Thus, the enable terminal EN of the multiplexer MC306 is set to "0". Also, it is judged that any one of the sequential circuit cells 2 is not used in the division areas Area1 and Area2. Thus, the enable terminals EN of the multiplexers MC301 and MC302 or the multiplexers MC201 and MC202 are set to "0". Moreover, it is judged that any one of the sequential circuit cells 2 is not used in the division areas Area13 to Area16. Hence, the enable terminals EN of the multiplexers MC313 to MC316 or the multiplexers MC213 to MC216 are set to "0". Then, the enable terminals EN except the above-mentioned terminals are set to "1".

The enable terminal EN is set by connecting the wiring pattern to the enable terminal EN. If the enable terminal EN is set to "1", the wiring pattern coupled to the power supply is connected. If it is set to "0", the wiring pattern coupled to the ground is connected.

As mentioned above, in the semiconductor integrated circuit according to this third embodiment, the distribution of the clock signal to the division areas constituted only by the non-used sequential circuit cell 2 is stopped to thereby stop the operation of the non-used sequential circuit cell 2. Thus, the electric power consumption as the entire semiconductor integrated circuit can be reduced over the conventional technique, similarly to the first embodiment.

As described above, according to the present invention, the sequential circuit cells and the combinational circuit cells are alternately arranged in the inner core area on the semiconductor chip, and the plurality of selective driving elements, which are connected in the shape of the tree, for selectively distributing the poliphase clock signal for each division area formed by uniformly dividing the inner core area are installed. Then, the plurality of selective driving elements are arranged and connected such that the portions to the sequential circuit cells within the respective division areas from the input terminals to which the poliphase clock signal is inputted are equal to each other in load and wiring length, on the semiconductor chip. Thus, it is possible to attain the clock tree structures which cope with the poliphase clock signal and are equal in load and wiring length. Hence, it is possible to reduce the clock skew between the sequential circuits.

Also, the sequential circuit cell includes a first logical gate element placed at a first stage of a clock input portion and a second logical gate element, wherein for a sequential circuit cell to be used, a wiring for a connection is laid between an output terminal of the first logical gate element and an input terminal of the second logical gate element, and for a sequential circuit cell to be not used, the wiring is not laid between the output terminal of the first logical gate element and the input terminal of the second logical gate element, and the input terminal of the second logical gate element is connected to the power supply or the ground. Thus, since the electric power consumed by the non-used sequential circuit cell can be reduced, the loss of the electric power consumption can be reduced to a minimum while the equal load structure is kept.

Also, the sequential circuit cell includes: the first logical gate element, which is placed at the first stage of the clock input portion, for enabling the first state at which the output potential is determined on the basis of the poliphase clock signal or the second state at which the output potential is constant irrespectively of the poliphase clock signal to be selected through the enable signal; and the second logical gate element in which the input terminal is connected to the output terminal of the first logical gate element, wherein for the sequential circuit cell to be used, the enable signal is set such that the first logical gate element becomes at the first state, and for the sequential circuit cell to be not used, the enable signal is set such that the first logical gate element becomes at the second state. Thus, since the electric power consumed by the non-used sequential circuit cell can be reduced, the loss of the electric power consumption can be reduced to a minimum while the equal load structure is kept.

Moreover, if any one of the sequential circuit cells placed in the division areas on the downstream side from one selective driving element of the plurality of selective driving elements is not used, the output of the one selective driving element is designed to be prevented. Thus, it is possible to reduce the electric power consumed by the non-used sequential circuit cell, and possible to suppress the loss of the electric power consumption to a minimum while keeping the equal load structure.

What is claimed is:

1. A master slice type semiconductor integrated circuit comprising:

sequential circuit cells and combinational circuit cells that are alternately arranged in an inner core area on a semiconductor chip; and a plurality of selective driving elements which are connected in a shape of a tree to selectively distribute a poliphase clock signal for each division area formed by uniformly dividing said inner core area, wherein said plurality of selective driving elements are arranged and connected on said semiconductor chip such that load and wiring length between input terminals to which said poliphase clock signal is inputted and said sequential circuit cells within the respective division areas are equal to each other.

2. The semiconductor integrated circuit according to claim 1, wherein each of said sequential circuit cells comprises:

a first logical gate element placed at a first stage of a clock input portion to which said poliphase clock signal is inputted; and a second logical gate element placed immediately after said first logical gate element, and wherein in a sequential circuit cell to be used in said sequential circuit cells, a wiring is laid between an output terminal of said first logical gate element and an input terminal of said second logical gate element, and in an sequential circuit cell to be not used in said sequential circuit cells, said wiring is not laid between said output terminal of said first logical gate element and said input terminal of said second logical gate element, and said input terminal of said second logical gate element is connected to a power supply or a ground.

3. The semiconductor integrated circuit according to claim 1, wherein each of said sequential circuit cells comprises:

a first logical gate element which is placed at a first stage of said clock input portion to which said poliphase clock signal is inputted, and selects a first state at which an output potential is determined based on said poliphase clock signal or a second state at which said output potential is constant irrespectively of said poliphase clock signal base on an enable signal; and a second logical gate element in which an input terminal is connected to an output terminal of said first logical gate element, and wherein in a sequential circuit cell to be used in said sequential circuit cells, said enable signal is set such that said first logical gate element becomes at said first state, and in a sequential circuit cell to be not used in said sequential circuit cells, said enable signal is set such that said first logical gate element becomes at said second state.

4. The semiconductor integrated circuit according to claim 1, wherein when a sequential circuit cell placed in said each division area to which said poliphase clock signal is distributed by one selective driving element of said plurality of selective driving elements, or a sequential circuit cell placed in said each division area to which said poliphase clock signal is distributed by said one selective driving element through a different selective driving element is not used, an output of said one selective driving element is prevented.

5. A layout method of a master slice type semiconductor integrated circuit comprising the steps of:
- arranging sequential circuit cells and combinational circuit cells in an inner core area on a semiconductor chip; and
- arranging and connecting, in a shape of a tree, a plurality of selective driving elements to selectively distribute a poliphase clock signal for each division area formed by uniformly dividing said inner core area,
- wherein said plurality of selective driving elements are arranged and connected on said semiconductor chip such that load and wiring length between input terminals to which said poliphase clock signal is inputted and said sequential circuit cells within the respective division areas are equal to each other.

6. The layout method of a master slice type semiconductor integrated circuit according to claim 5, wherein
- each of said sequential circuit cell is formed at a situation that a wiring is not laid between a first logical gate element placed at a first stage of a clock input to which said poliphase clock signal is inputted and a second logical gate element placed immediately after said first logical gate element,
- wherein in a sequential circuit cell to be used in said sequential circuit cells, an output terminal of said first logical gate element and an input terminal of said second logical gate element are connected to each other at an arrangement wiring step, and
- in a sequential circuit cell to be not used in said sequential circuit cells, said wiring is not laid between said output terminal of said first logical gate element and said input terminal of said second logical gate element, and said input terminal of said second logical gate element is wired and connected to a power supply or a ground at said arrangement wiring step.

7. The layout method of a semiconductor integrated circuit according to claim 5, wherein said sequential circuit cell comprises:
- a first logical gate element which is placed at a first stage of a clock input portion to which said poliphase clock signal is inputted, and selects a first state at which an output potential is determined based on said poliphase clock signal or a second state at which the output potential is constant irrespectively of said poliphase clock signal based on an enable signal; and
- a second logical gate element in which an input terminal is connected to an output terminal of said first logical gate element, and
- wherein in a sequential circuit cell to be used in said sequential circuit cells, a value of said enable signal is set such that said first logical gate element becomes at said first state, in an arrangement wiring step, and
- in a sequential circuit cell to be not used in said sequential circuit cells, a value of said enable signal is set such that said first logical gate element becomes at said second state, in said arrangement wiring step.

8. The layout method of a semiconductor integrated circuit according to claim 5,
- wherein when a sequential circuit cell placed in said each division area to which said poliphase clock signal is distributed by one selective driving element of said plurality of selective driving elements, or a sequential circuit cell placed in said each division area to which said poliphase clock signal is distributed by said one selective driving element through a different selective driving element is not used, an output of said one selective driving element is prevented.

* * * * *